United States Patent
Ninomiya et al.

(10) Patent No.: US 11,190,111 B2
(45) Date of Patent: Nov. 30, 2021

(54) VIBRATION WAVE MOTOR AND ELECTRONIC EQUIPMENT USING VIBRATION WAVE MOTOR

(71) Applicant: CANON KABUSHIKI KAISHA, Tokyo (JP)

(72) Inventors: Shunsuke Ninomiya, Fujisawa (JP); Mai Nakabayashi, Abiko (JP)

(73) Assignee: CANON KABUSHIKI KAISHA, Tokyo (JP)

(*) Notice: Subject to any disclaimer, the term of this patent is extended or adjusted under 35 U.S.C. 154(b) by 672 days.

(21) Appl. No.: 16/100,613

(22) Filed: Aug. 10, 2018

(65) Prior Publication Data
US 2019/0052194 A1     Feb. 14, 2019

(30) Foreign Application Priority Data
Aug. 14, 2017   (JP) .............................. JP2017-156400

(51) Int. Cl.
*H02N 2/00*   (2006.01)
*H02N 2/08*   (2006.01)
(Continued)

(52) U.S. Cl.
CPC ............... *H02N 2/001* (2013.01); *B06B 1/06* (2013.01); *B06B 1/0644* (2013.01);
(Continued)

(58) Field of Classification Search
CPC ...... H02N 2/001; H02N 2/006; H02N 2/0065; H02N 2/026; H02N 2/08; H01L 41/0825; H01L 41/09
(Continued)

(56) References Cited

U.S. PATENT DOCUMENTS

2011/0031847 A1* 2/2011 Sakamoto ............... H02N 2/04
                                                                310/323.02

FOREIGN PATENT DOCUMENTS

| CN | 101702592 A | 5/2010 |
| CN | 102223104 A | 10/2011 |

(Continued)

OTHER PUBLICATIONS

The above foreign patent documents were cited in the Oct. 3, 2019 Japanese Office Action, which is enclosed without an English Translation, that issued in Japanese Patent Application No. 2017156400.
The above foreign patent document was cited in a Feb. 3, 2020 Chinese Office Action, which is enclosed with an English Translation, that issued in Chinese Patent Application No. 201810915159.4.

(Continued)

*Primary Examiner* — Derek J Rosenau
(74) *Attorney, Agent, or Firm* — Cowan, Liebowitz & Latman, P.C.

(57) ABSTRACT

Provided is a vibration wave motor, including: a vibration body; a friction member; a press member configured to pressurize the vibration body against the friction member; a base member configured to fix the friction member; and a damping member configured to damp vibration, wherein the vibration body and the friction member are configured to move relative to each other, wherein the friction member includes: a first surface having a first region held in abutment against the vibration body; and a second surface, which is a back surface of the first surface, and has a second region held in abutment against the base member, wherein at least one of the first surface and the second surface has a third region held in contact with the damping member, and wherein positions of the first region and the third region in a pressurizing direction of the press member are different from each other.

19 Claims, 16 Drawing Sheets

(51) Int. Cl.
  *B06B 1/06*   (2006.01)
  *H01L 41/09*  (2006.01)
  *H02N 2/02*   (2006.01)
  *H01L 41/08*  (2006.01)

(52) U.S. Cl.
  CPC .......... *H01L 41/0825* (2013.01); *H01L 41/09* (2013.01); *H02N 2/006* (2013.01); *H02N 2/0065* (2013.01); *H02N 2/026* (2013.01); *H02N 2/08* (2013.01)

(58) Field of Classification Search
  USPC ....................................... 310/323.01–323.21
  See application file for complete search history.

(56) References Cited

FOREIGN PATENT DOCUMENTS

| | | |
|---|---|---|
| CN | 103227585 A | 7/2013 |
| JP | 2000-324865 A | 11/2000 |
| JP | 2001268949 A | 9/2001 |
| JP | 2014-236522 A | 12/2014 |
| JP | 2014236522 A | 12/2014 |
| JP | 2016-082802 A | 5/2016 |

OTHER PUBLICATIONS

The above foreign patent documents were cited in the Feb. 26, 2019 Japanese Office Action, which is enclosed without an English Translation, that issued in Japanese Patent Application No. 2017156400.

\* cited by examiner

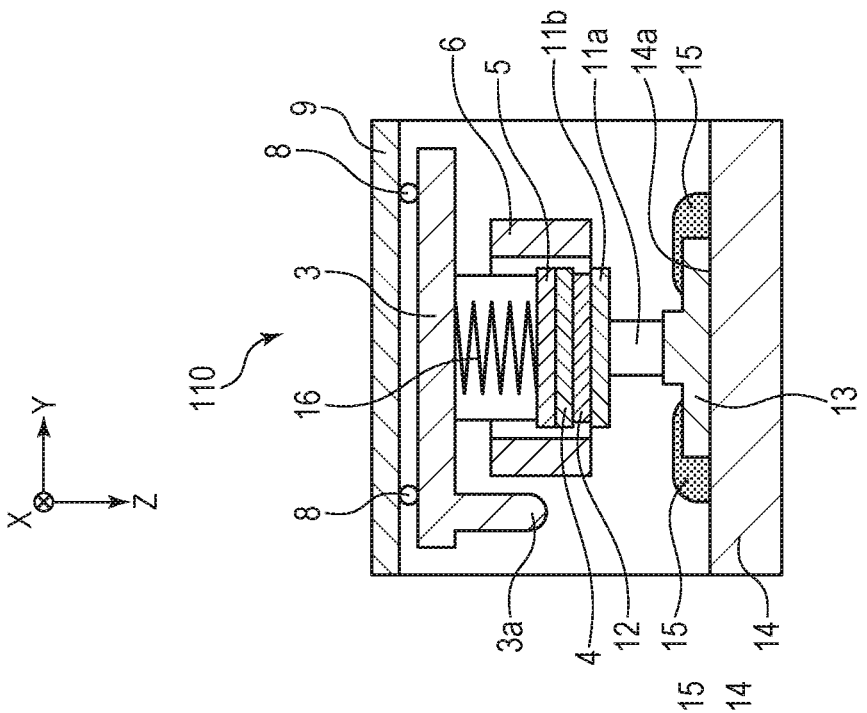
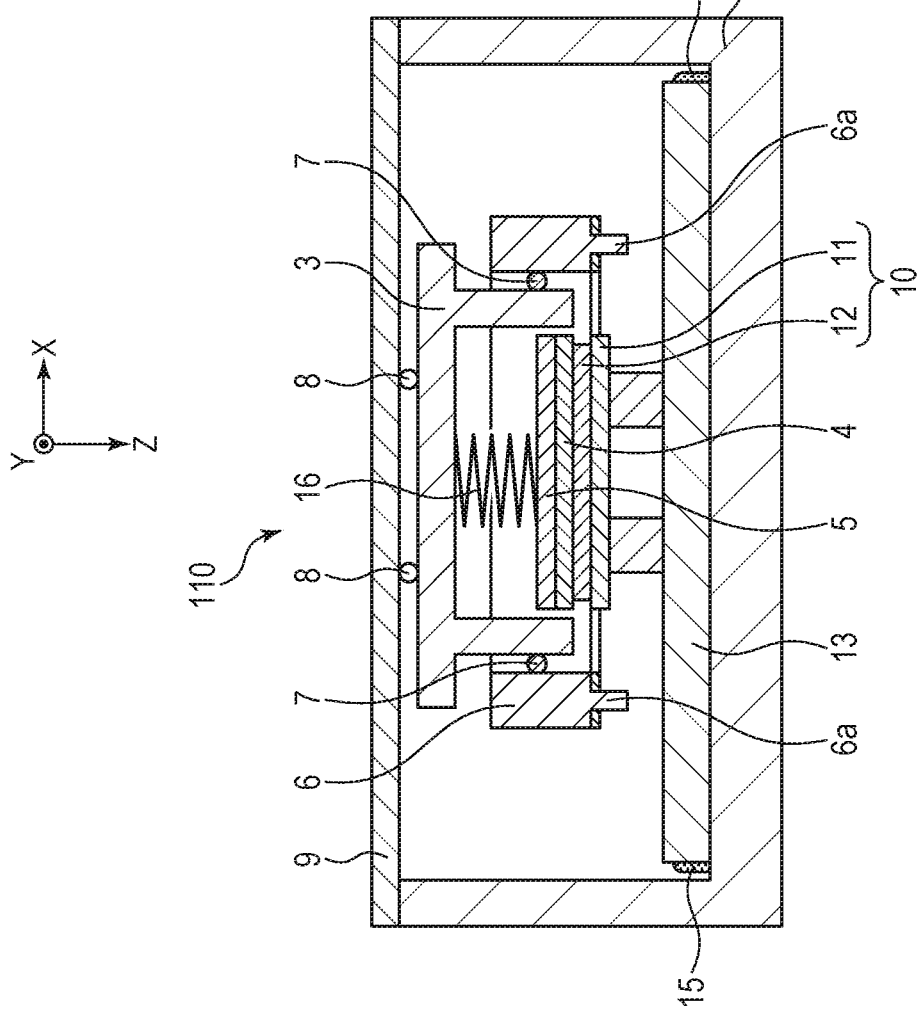

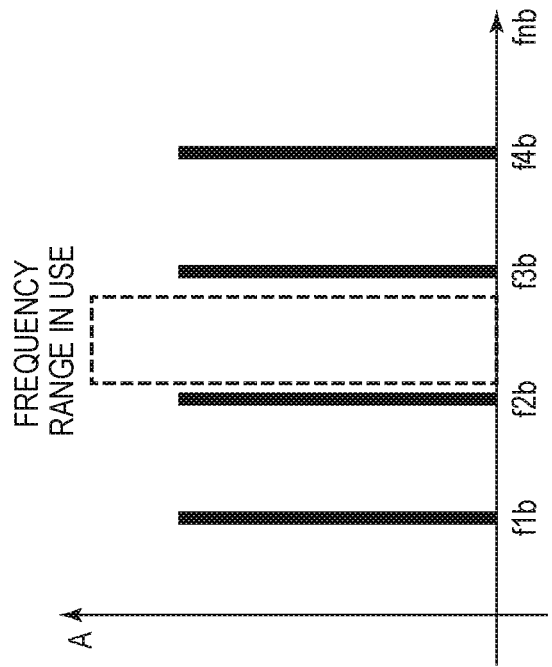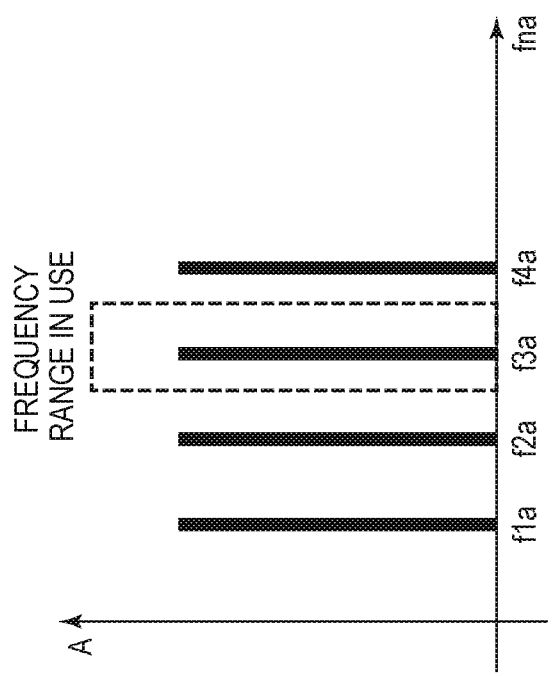

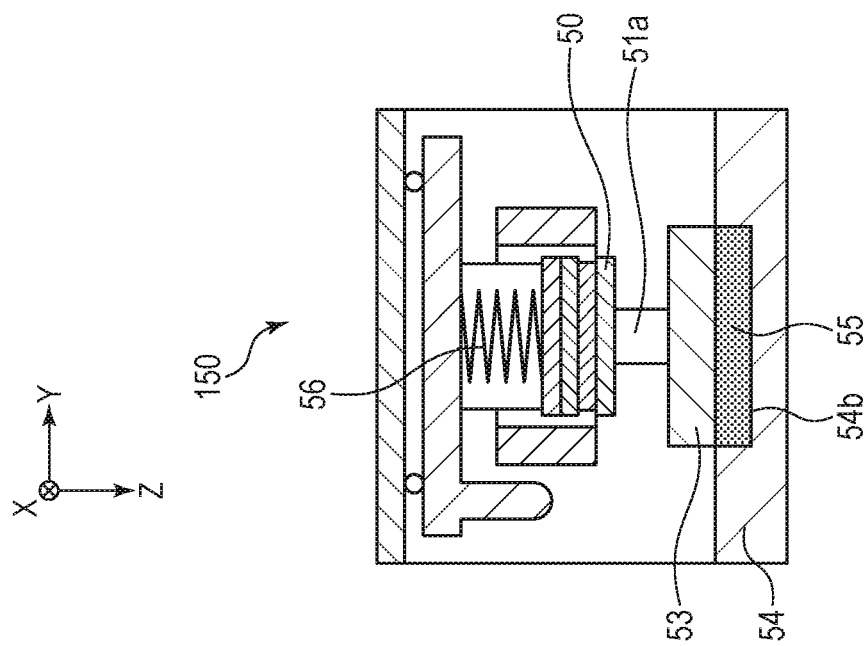
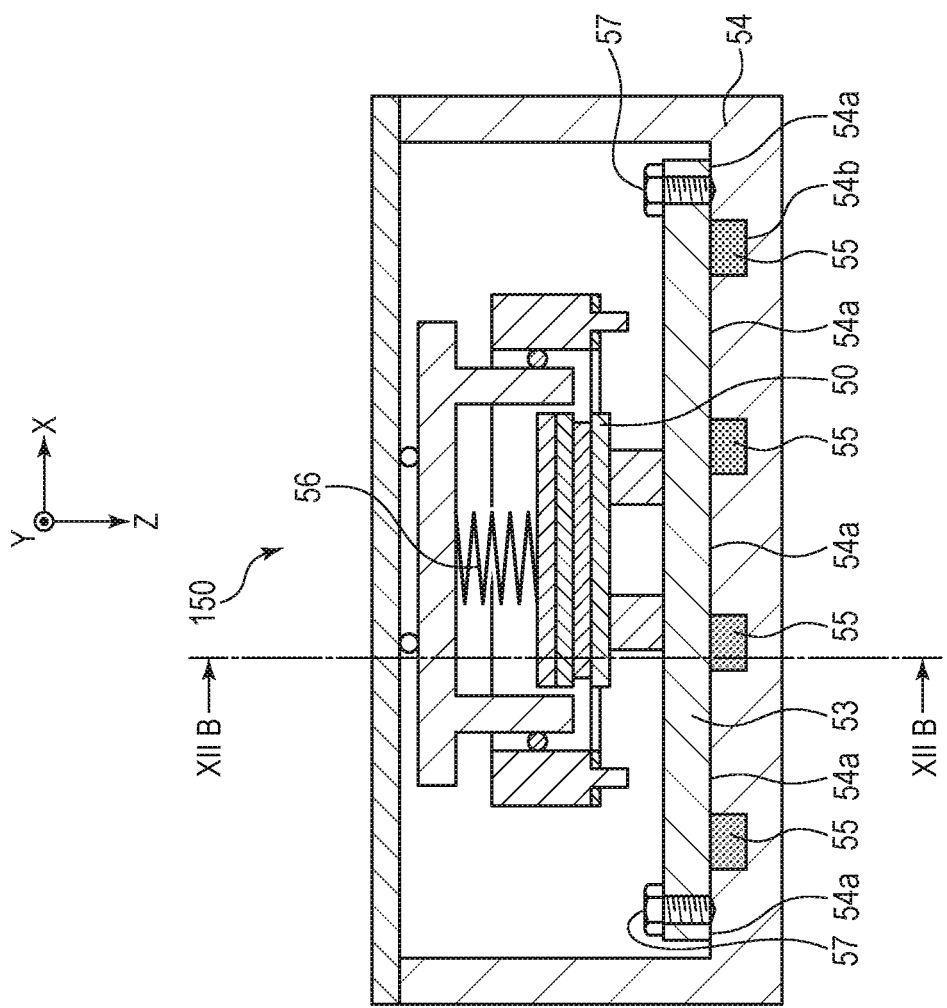

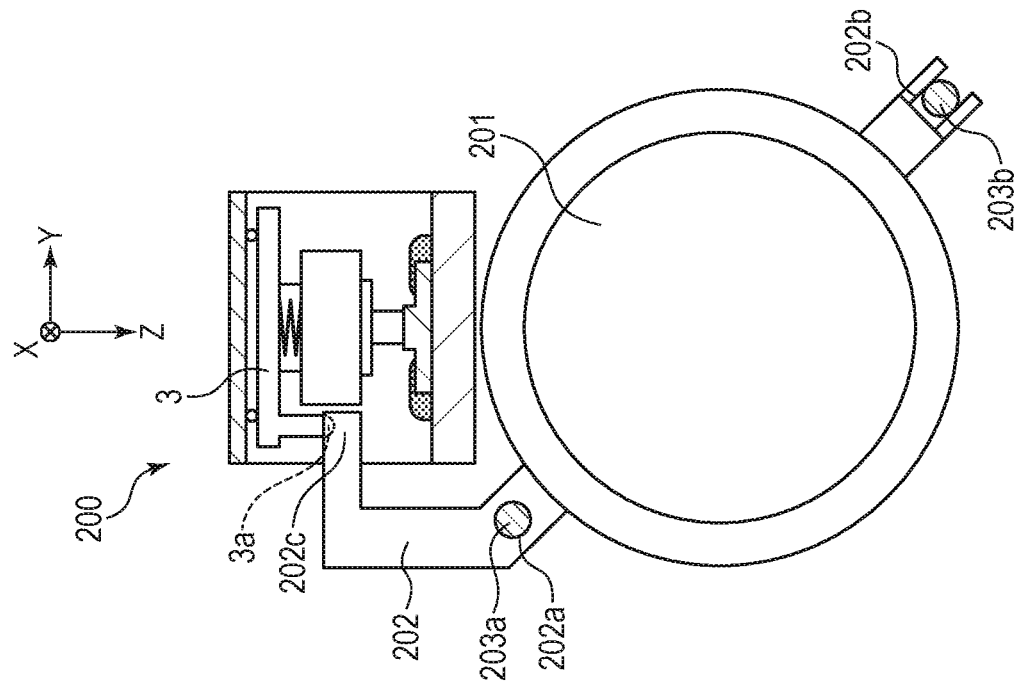
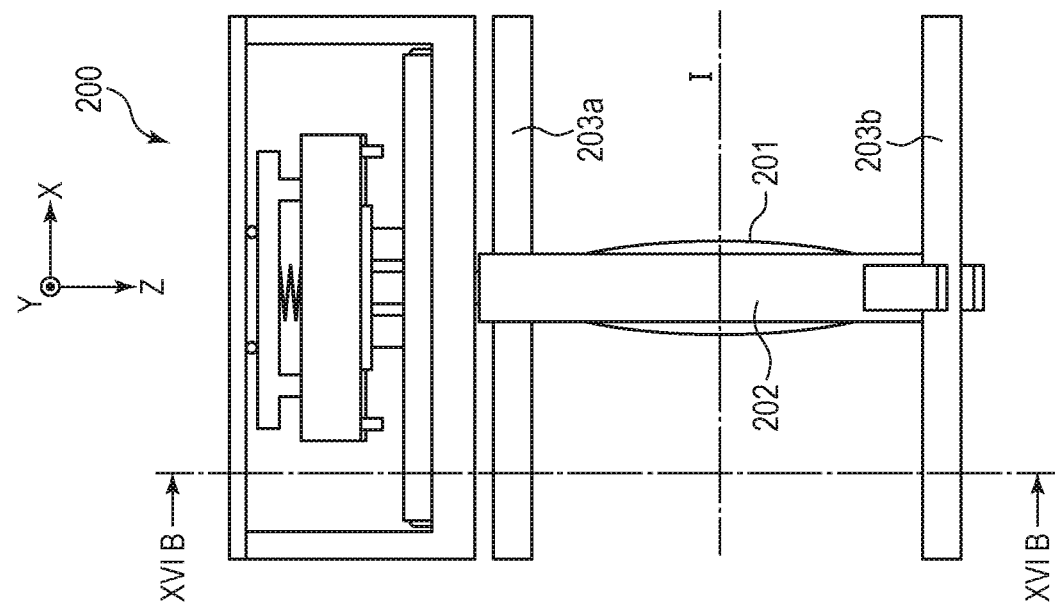

VIBRATION WAVE MOTOR AND ELECTRONIC EQUIPMENT USING VIBRATION WAVE MOTOR

BACKGROUND OF THE INVENTION

Field of the Invention

The present invention relates to a vibration wave motor, and more particularly, to a linear vibration wave motor including an elastic body having a plate shape, and to an electronic equipment configured to drive a driven member using the linear vibration wave motor.

Description of the Related Art

Hitherto, an ultrasonic motor having features of small size and weight, high-speed drive, and low-noise drive has been employed in an actuator for, for example, a lens barrel of an image pickup apparatus. There exist ultrasonic motors of various modes. Among the ultrasonic motors, an ultrasonic motor for linear drive is disclosed in Japanese Patent Application Laid-Open No. 2016-82802. The ultrasonic motor disclosed in Japanese Patent Application Laid-Open No. 2016-82802 includes a vibrator, a friction member (slider), and a press spring. The vibrator includes a piezoelectric element and a vibration plate. The friction member is held in press contact with the vibrator and has a relatively large and even thickness. The press spring is configured to pressurize the vibrator against the friction member. High-frequency vibration is generated in the vibrator, and an elliptic motion is generated at each of distal ends of projection portions formed on the vibrator, thereby enabling a vibration body to move relative to the friction member.

SUMMARY OF THE INVENTION

In the ultrasonic motor disclosed in Japanese Patent Application Laid-Open No. 2016-82802, the vibration generated in the friction member is suppressed by a vibration absorbing member. Moreover, for the purpose of further reducing size and cost, reduction in thickness of the friction member has been demanded. However, when the friction member is reduced in thickness, intervals of resonance frequencies become smaller, with the result that resonance is liable to occur around a drive frequency band. There has been a problem in that the resonance causes generation of unnecessary vibration of the friction member to cause degradation in characteristic of the ultrasonic motor and generation of noise.

An object of the present invention is to provide a vibration wave motor including a damping member provided for the purpose of reducing unnecessary vibration of a friction member, thereby suppressing noise of the vibration wave motor caused by the unnecessary vibration of the friction member and achieving reduction in size and cost.

In order to solve the above-mentioned problem, a vibration wave motor according to one embodiment of the present invention includes: a vibration body including a piezoelectric element; a friction member held in friction contact with the vibration body; a press member configured to pressurize the vibration body against the friction member; a base member configured to fix the friction member; and a damping member configured to damp vibration generated in the friction member, wherein the vibration body and the friction member are configured to move relative to each other, wherein the friction member includes: a first surface having a first region held in abutment against the vibration body; and a second surface, which is a back surface of the first surface, and has a second region held in abutment against the base member, wherein at least one of the first surface and the second surface has a third region held in contact with the damping member, and wherein positions of the first region and the third region in a pressurizing direction of the press member are different from each other.

According to the one embodiment of the present invention, there can be provided a vibration wave motor including the damping member provided for the purpose of reducing unnecessary vibration of the friction member, thereby suppressing noise of the vibration wave motor caused by the unnecessary vibration generated in the friction member and achieving reduction in size and cost.

Further features of the present invention will become apparent from the following description of exemplary embodiments with reference to the attached drawings.

BRIEF DESCRIPTION OF THE DRAWINGS

FIG. 2A and FIG. 2B are each a sectional view for illustrating a configuration of a vibration wave motor 110 according to the first embodiment.

FIG. 9A and FIG. 9B are each a graph for showing characteristics of resonance frequencies fn of the friction member 33 in the third embodiment.

FIG. 12A and FIG. 12B are each a sectional view for illustrating a configuration of a vibration wave motor 150 according to a fifth embodiment of the present invention.

FIG. 16A is a front view for illustrating a lens driving device 200 according to an application example of the present invention.

FIG. 16B is a sectional view of FIG. 16A.

DESCRIPTION OF THE EMBODIMENTS

Figure 1A:
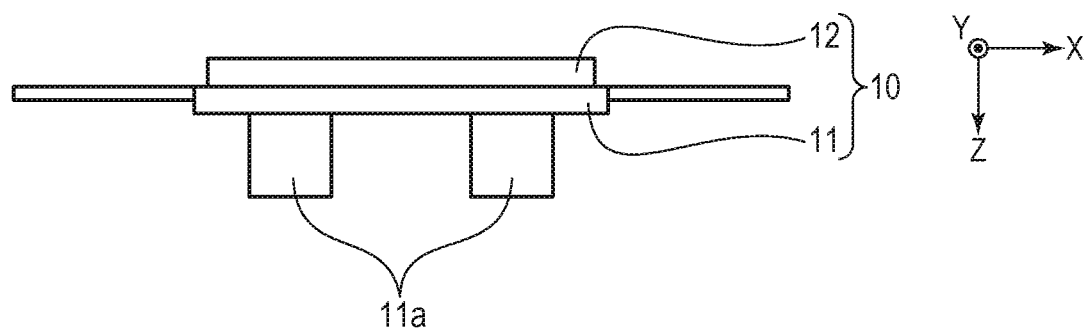
FIG. 1A and FIG. 1B are each a view for illustrating a configuration of a vibration body 10 in a first embodiment of the present invention.

Preferred embodiments of the present invention will now be described in detail in accordance with the accompanying drawings.

In the drawings, the same reference symbols represent the same members. In the specification, a relative movement direction in which a vibration body 10 described later and a friction member 13 described later move relative to each other is referred to as "X direction", and a pressurizing direction in which the vibration body 10 is pressurized against the friction member 13 is referred to as "Z direction". In the Z direction, a direction from the vibration body 10 toward the friction member 13 is defined as "plus Z direction", and a direction from the friction member 13 toward the vibration body 10 is defined as "minus Z direction". Moreover, an orthogonal direction which is orthogonal to the X direction and to the Z direction is referred to as "Y direction".

Figure 1B:
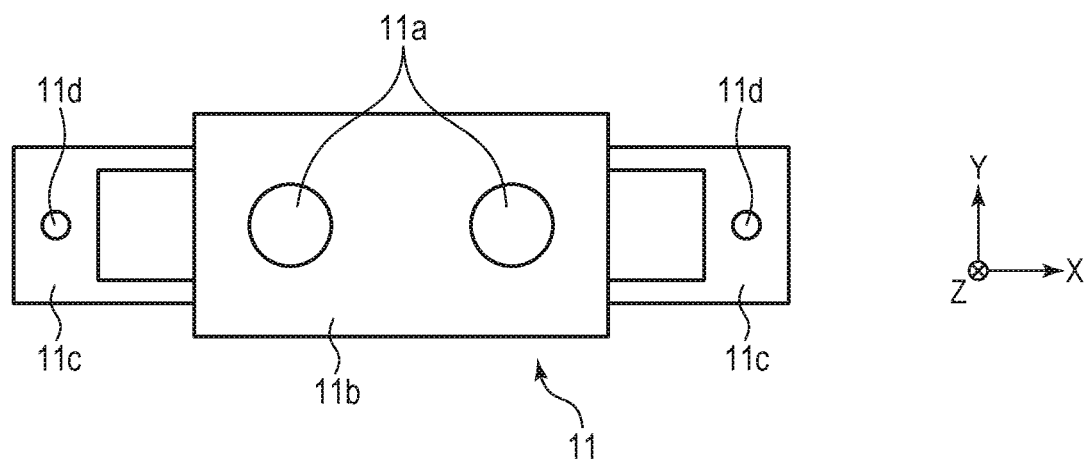

FIG. 1A is a front view of the vibration body 10 in an embodiment of the present invention. FIG. 1B is a bottom view of the vibration body 10. The vibration body 10 includes a vibration plate 11 and a piezoelectric element 12. The vibration plate 11 includes a flat plate portion 11b having a rectangular shape and projection portions 11a formed on the flat plate portion 11b. The piezoelectric element 12 which performs high-frequency vibration is fixed to the vibration plate 11.

Through application of a high-frequency drive voltage having a frequency "f" in an ultrasonic range to the piezoelectric element 12, the vibration body 10 performs high-frequency vibration (ultrasonic vibration) to resonate in respective unique vibration modes in the X direction being a longitudinal direction and the Y direction being a transverse direction. Such resonance causes an elliptic motion at each of distal ends of the projection portions 11a. The vibration body 10 is pressurized against the friction member 13 (contact member) described later, and causes the above-mentioned elliptic motion under a state in which the vibration body 10 including the projection portions 11a and the flat plate portion 11b is held in contact (friction contact) with the friction member 13, thereby being capable of obtaining a drive force through a friction force. This drive force allows the vibration body 10 to move relative to the friction member 13. Further, the vibration plate 11 includes retaining portions 11c configured to fix the vibration body 10 to a retaining member 6 described later.

Next, description is made of a configuration of a vibration wave motor 110 according to the embodiment of the present invention. FIG. 2A is a sectional view for illustrating the vibration wave motor 110 according to the embodiment, which is taken along an X-Z plane passing through a center of a press member 16. FIG. 2B is a sectional view for illustrating the vibration wave motor 110, which is taken along a Y-Z plane passing through the center of the press member 16.

The vibration body 10 is fixed to the retaining member 6 by engaging retaining holes 11d, which are formed at end portions of the retaining portions 11c of the vibration plate 11, with retaining shafts 6a of the retaining member 6. The press member 16 is a member configured to pressurize the vibration body 10 against the friction member 13, and acts on a movable member 3 and a pressurizing plate 5. The pressurizing plate 5 applies a pressurizing force generated by the press member 16 to the vibration body 10 through a buffer member 4. The pressurization through the pressurizing plate 5 allows the pressurizing force to be evenly applied to a surface of the piezoelectric element 12. Moreover, the pressurization through the buffer member 4 allows the vibration body 10 to be pressurized while suppressing damping of the vibration of the vibration body 10.

The movable member 3 is a member configured to transmit the drive force of the vibration wave motor 110 to a lens 201 described later, and includes a coupling portion 3a configured to couple the lens 201 and the vibration wave motor 110 to each other. The retaining member 6 and the movable member 3 are coupled to each other through intermediation of rolling members 7. Therefore, when the retaining member 6 moves in the relative movement direction, the movable member 3 can move integrally with the retaining member 6. Moreover, through rolling of the rolling members 7, the retaining member 6 and the movable member 3 can move relative to each other in the pressurizing direction. With such a configuration, for example, even when a dimensional error or an assembly error of a component occurs, the vibration body 10 can be stably pressurized against the friction member 13 with the pressurizing force of the press member 16.

A base member 14 is a member to which the friction member 13 is fixed. Further, a cover member 9 is fixed to the base member 14 by, for example, a screw (not shown). Ball members 8 are provided between the movable member 3 and the cover member 9. When the movable member 3 moves in the relative movement direction, the ball members 8 roll to reduce a slide load generated by a pressurization reaction force of the press member 16.

As described above, with the drive force generated by the high-frequency vibration, the vibration body 10 can move relative to the friction member 13. With such drive force, the vibration body 10, the retaining member 6, and the movable member 3 can be moved integrally in the relative movement direction.

Figure 3A:
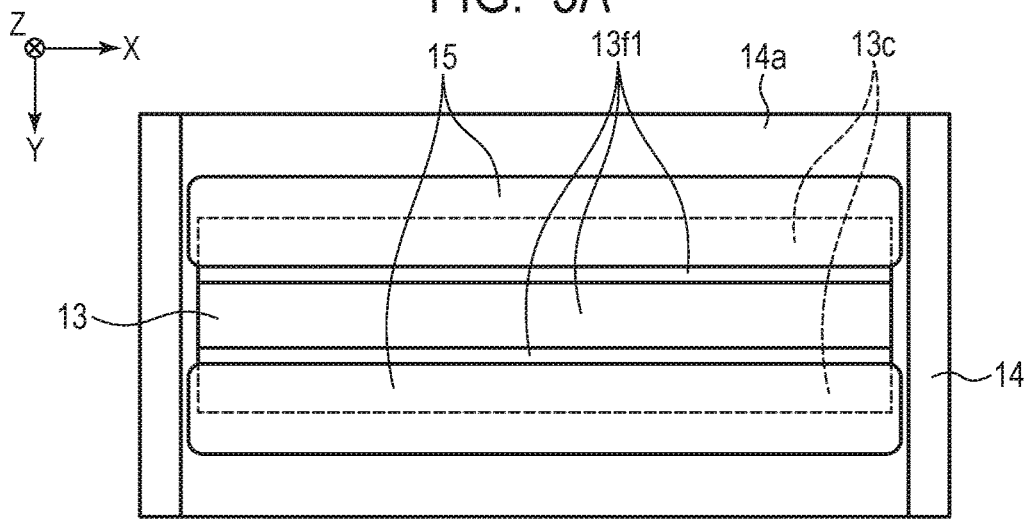
FIG. 3A, FIG. 3B, and FIG. 3C are each a view for illustrating configurations of a friction member 13 and damping members 15 in the first embodiment.
Figure 3B:
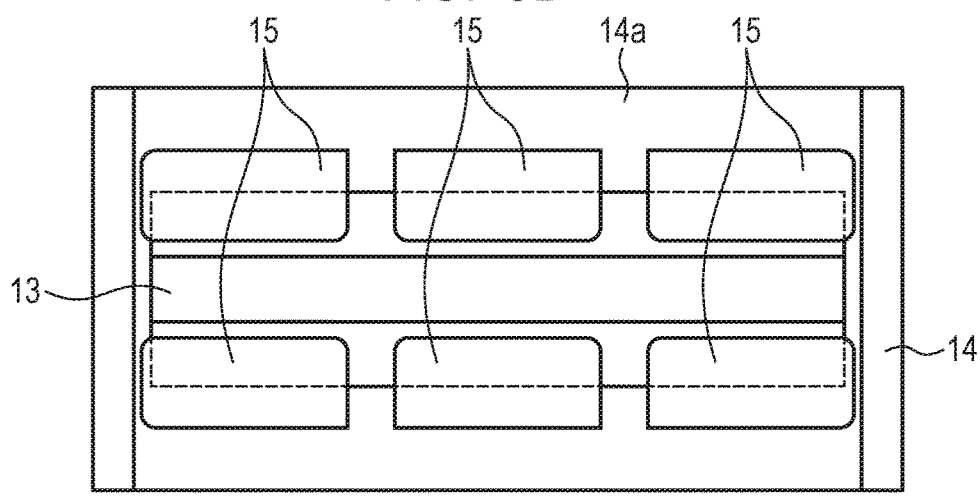
Figure 3C:
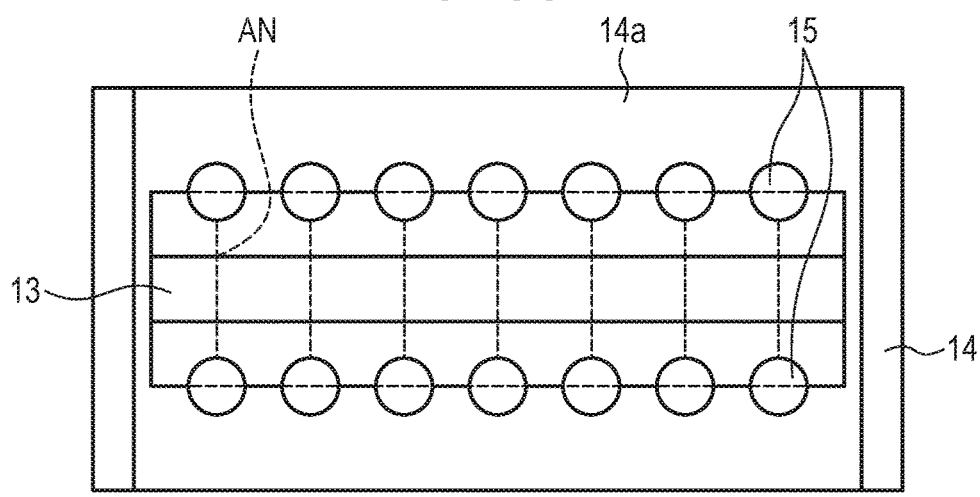
Figure 4B:
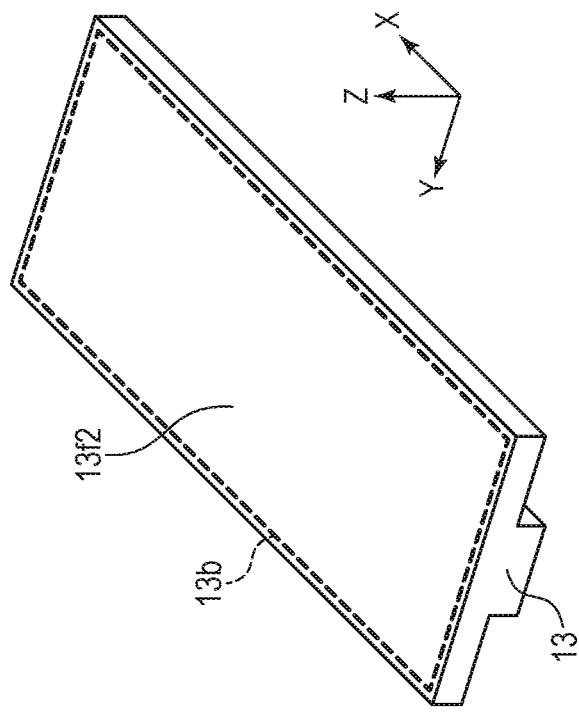
FIG. 4A and FIG. 4B are each a perspective view for illustrating a configuration of the friction member 13 in the first embodiment.
Figure 4A:
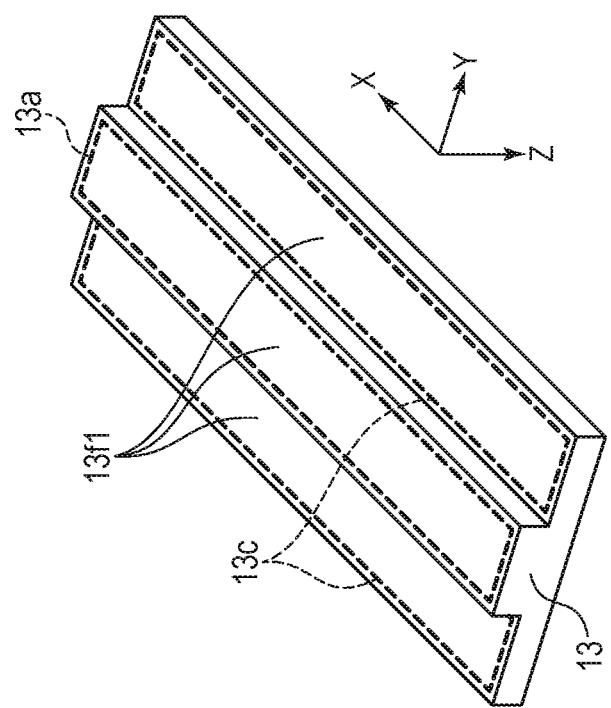

Next, description is made of a shape of the friction member 13 and a fixing method for the friction member 13. FIG. 3A to FIG. 3C are each a view for illustrating configurations of the friction member 13 and damping members 15, and are each a plan view in which only the friction member 13, the base member 14, and the damping members 15 are illustrated. FIG. 4A and FIG. 4B are perspective views for illustrating the friction member 13 as seen from different angles. The friction member 13 is formed of a plate-like member which is reduced in thickness, and includes sliding side surfaces 13f1 and a fixing side surface 13f2. The sliding side surfaces 13f1 define a first surface, which is a surface on the vibration plate 11 side and is held in abutment against the vibration body 10. The fixing side surface 13f2 defines a second surface, which is a back surface of the first surface and is held in abutment against the base member 14. The first surface has a sliding region 13a (first region), which is held in abutment against the vibration body 10 and is formed so as to extend in the relative movement direction. The second surface has a fixing region 13b (second region), which is held in abutment against the base member 14 to fix the friction member 13.

The damping members 15 are members which are held in contact with the friction member 13 and configured to damp unnecessary vibration generated in the friction member 13. In the embodiment illustrated in FIG. 3A and FIG. 4A, the first surface further has damping regions 13c (third regions) held in contact with the damping members 15, and the damping members 15 are held in contact with the first surface. However, another embodiment in which the third region held in contact with the damping members 15 is formed on the second surface can also be implemented. That is, the third region is formed on at least one of the first surface and the second surface so that unnecessary vibration generated in the friction member 13 is reduced by the damping members 15.

Further, the friction member 13 is not a flat plate having an even thickness, and hence the first region and the third regions can be located at different positions in the pressurizing direction. With such a configuration, interference of the damping members 15 with the first region can be prevented, and reduction in size and cost of the device can be achieved.

First Embodiment

Description is made of a first embodiment of the present invention with reference to FIG. 2B, FIG. 4A, and FIG. 4B. The friction member 13 used for the vibration wave motor 110 according to the first embodiment includes the sliding side surfaces 13/1 and the fixing side surface 13/2, and the fixing side surface 13/2 is formed on a back side of the sliding side surfaces 13/1. On the sliding side surface 13/1 side, there are formed the sliding region 13a held in abutment against the projection portions 11a of the vibration body 10 and the damping regions 13c held in contact with the damping members 15. Meanwhile, on the fixing side surface 13/2, there is formed the fixing region 13b, which is held in abutment against a fixing surface 14a of the base member 14 to fix the friction member 13. The damping regions 13c extend in the relative movement direction, and are divided on both outer sides of the sliding region 13a and formed adjacent to the sliding region 13a in the orthogonal direction (Y direction). Thus, the damping members 15 are provided with respect to the sliding region 13a in the orthogonal direction rather than in the relative movement direction. The fixing region 13b extends on the entirety of the fixing side surface 13/2. The sliding side surfaces 13/1, the fixing side surface 13/2, the sliding region 13a, the fixing region 13b, and the damping regions 13c correspond to the first surface, the second surface, the first region, the second region, and the third region described in claims, respectively.

The friction member 13 in the first embodiment is not a flat plate having an even thickness, and is a flat plate reduced in thickness. Specifically, the thickness of each of the two damping regions 13c is smaller than a thickness of the sliding region 13a in the Z direction, and the friction member 13 has a T-shaped cross section. In other words, the sliding region 13a projects toward the vibration body 10 side than the two damping regions 13c, and the damping regions 13c are located in the plus Z direction with respect to the sliding region 13a. Thus, the damping regions 13c are arranged more apart from the vibration body 10 than the sliding region 13a in the pressurizing direction of the press member 16. That is, positions of the sliding region 13a and the damping regions 13c are different in the pressurizing direction of the press member 16. Further, a surface roughness of the damping regions 13c is larger than a surface roughness of the sliding region 13a.

The base member 14 in the first embodiment has, as a flat surface thereof, the fixing surface 14a held in abutment against the fixing region 13b of the friction member 13 and the damping members 15.

The damping members 15 in the first embodiment are each an adhesive. Under a state in which the fixing region 13b of the friction member 13 and the fixing surface 14a of the base member 14 are held in contact with each other, the damping members 15 are supplied onto the damping regions 13c. Then, the damping members 15 are cured so that the friction member 13 is bonded and fixed to the base member 14. The adhesive in a liquid state is cured to form each damping member 15, and hence the damping members 15 are liable to be unevenly formed on the damping regions 13c. When the damping member 15 spreads to the sliding region 13a, the projection portions 11a are brought into contact with the damping member 15, with the result that the drive characteristic is degraded. However, in the first embodiment, the sliding region 13a is arranged so as to be higher in the minus Z direction than the damping regions 13c having the damping members 15. Therefore, even when the damping members 15 are unevenly formed, the damping members 15 are prevented from spreading to the sliding region 13a. Moreover, as illustrated in FIG. 3A, when an area supplied with the damping members 15 being the adhesive is large, the amount of contraction at the time of curing of the adhesive becomes larger, with the result that the residual stress becomes larger. However, as illustrated in FIG. 3B, the amount of contraction is reduced by dividing the regions supplied with the damping members 15, thereby being capable of reducing the residual stress and improving the bonding strength. Further, as illustrated in FIG. 3C, the damping members 15 are supplied partially in positions of antinodes AN of the unique vibration mode rather than in the entire region. With this, the cost can be reduced by reducing the amount of the damping members 15, and the vibration can be suppressed by pressing the antinodes AN from above.

Next, description is made of a configuration of a related-art example for comparison. FIG. 1 of Japanese Patent Application Laid-Open No. 2016-82802 is a view for illustrating a configuration of an ultrasonic motor of a related-art example. In the ultrasonic motor of the related-art example, a slider having a relatively large and even thickness is used, and the slider is fixed to the base member by screws. When the base member of the ultrasonic motor is fixed to a motor retaining member, a vibration absorbing member configured to absorb vibration generated in the slider is incorporated. When the ultrasonic motor is driven, high-frequency vibration of a vibrator is transmitted to the slider, and the resonance occurs in the slider, but the vibration absorbing member reduces unnecessary vibration caused by influence of the vibrator. However, when the slider is reduced in thickness for further reduction in size and cost of the ultrasonic motor, the intervals of the resonance frequencies become smaller, with the result that the resonance is liable to occur around the drive frequency band. Such resonance causes unnecessary vibration in the slider, and vibration of the vibrator is hindered. As a result, there arises a problem in that the characteristic of the ultrasonic motor is degraded, or noise is generated in the slider.

Next, description is made of the effect which can be attained with the configuration of the first embodiment as compared to the configuration of the related-art example. For the vibration wave motor 110 according to the first embodiment, the friction member 13 reduced in thickness is used. Even with such friction member 13 reduced in thickness, the thicknesses of the sliding region 13a and the damping regions 13c differ. Therefore, the damper members 15 supplied onto the damping regions 13c are prevented from spreading to the sliding region 13a. That is, the damping members 15 and the projection portions 11a are not brought into contact with each other, and hence the drive characteristic is not degraded. The damping members 15 are provided to the damping regions 13c of the sliding side surfaces 13/1 of the friction member 13, and the damping members 15 are held in contact with the friction member 13. That is, the unnecessary vibration (vibration outside the surface) generated in the friction member 13 reduced in thickness can be damped by fixing the friction member 13 to the base member 14 by pressure. Further, a range of the damping regions 13c held in contact with the damping members 15 is larger than a range in which the projection portions 11a slide on the sliding region 13a, thereby enhancing the damping effect. The surface roughness of the damping regions 13c is larger than the surface roughness of the sliding region 13a, and hence positional displacement in the relative movement direction is less liable to occur. The damping members 15 are provided to reduce the unnecessary vibration of the friction member 13. As a result, degradation in characteristic of the vibration wave motor 110 and generation of noise can be suppressed. Further, the damping members 15 are provided with respect to the sliding region 13a in the orthogonal direction rather than in the relative movement direction. Thus, the entirety of the vibration wave motor 110 is not increased in size in the relative movement direction.

In the first embodiment, the damping members 15 are each an adhesive, and are configured to fix the friction member 13 and damp the vibration of the friction member 13. However, the damping members 15 may be other than the adhesive and may be made of a material exerting the damping effect such as silicon rubber or a gel-like material. For example, the fixing side surface 13f2 of the friction member 13 and the fixing surface 14a of the base member 14 may be completely fixed to each other by another fixing means such as screws or an adhesive, and a material exerting the damping effect such as silicon rubber or a gel-like material may be supplied to a periphery of the friction member 13. That is, with the configuration in which the material exerting the damping effect is held in contact with the damping regions 13c, the unnecessary vibration generated in the friction member 13 can be damped.

Second Embodiment

Figure 5:
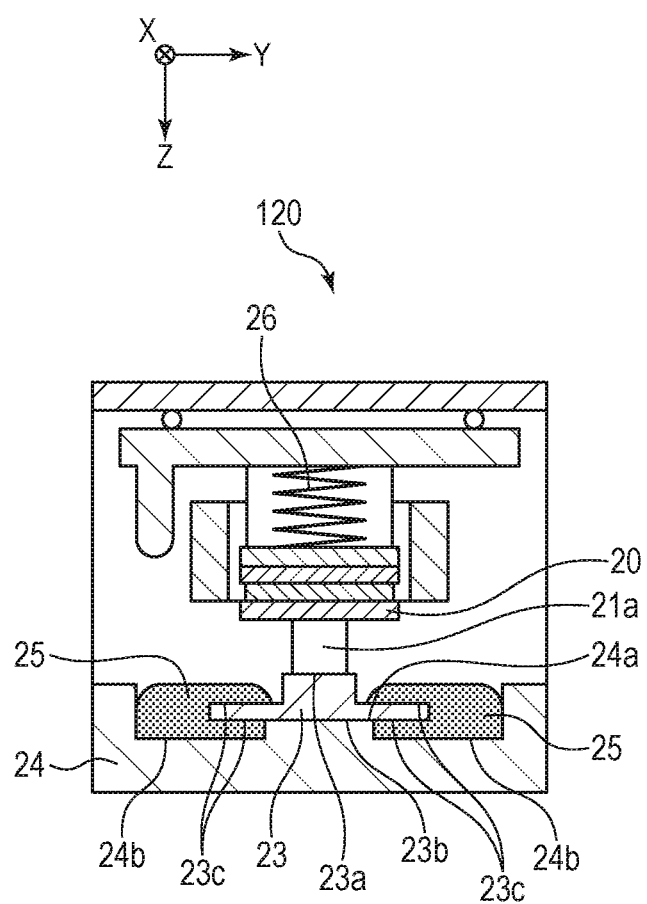
FIG. 5 is a sectional view for illustrating a configuration of a vibration wave motor 120 according to a second embodiment of the present invention.
Figure 6B:
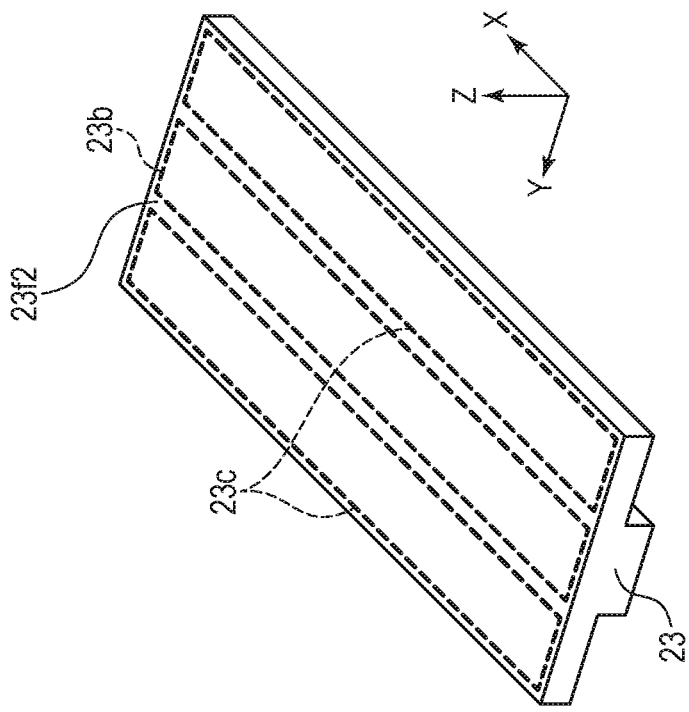
FIG. 6A and FIG. 6B are each a perspective view for illustrating a configuration of a friction member 23 in the second embodiment.
Figure 6A:
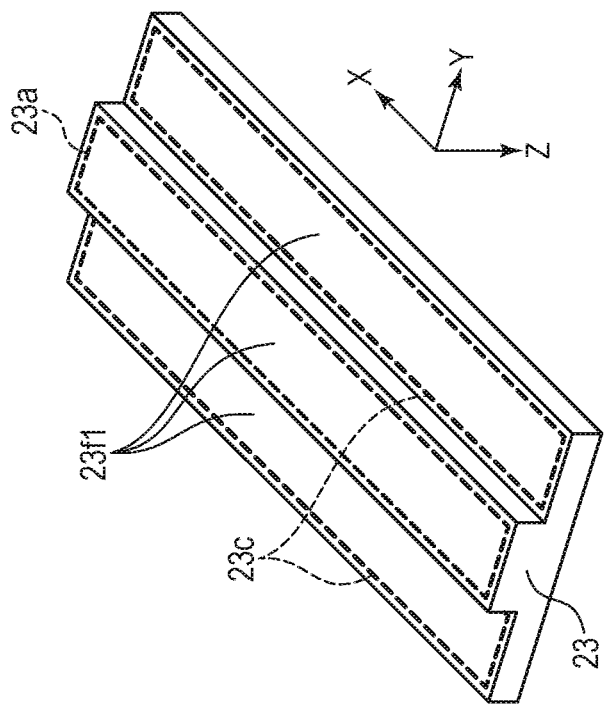

Next, description is made of a second embodiment of the present invention with reference to FIG. 5, FIG. 6A, and FIG. 6B. In the first embodiment, the entirety of the fixing side surface 13f2 of the friction member 13 corresponds to the fixing region 13b, and is held in contact with the fixing surface 14a of the base member 14. The damping regions 13c with which the damping members 15 are held in contact are formed only on the sliding side surface 13f1 side. In the second embodiment, damping regions 23c of a friction member 23 reduced in thickness are formed not only on sliding side surfaces 23f1 but also on a fixing side surface 23f2, and recessed portions 24b are formed in a base member 24. Those configurations are different from those of the first embodiment. Now, detailed description is made of configurations different from those of the first embodiment.

FIG. 5 is a sectional view for illustrating a configuration of a vibration wave motor 120 according to the second embodiment of the present invention, and is an illustration corresponding to FIG. 2B. FIG. 6A and FIG. 6B are perspective views for illustrating the friction member 23 used for the vibration wave motor 120 according to the second embodiment as seen from different angles. On the sliding side surface 23f1 side of the friction member 23, there are formed a sliding region 23a held in abutment against projection portions 21a of a vibration body 20, and damping regions 23c held in contact with damping members 25. Meanwhile, on the fixing side surface 23f2, there are formed a fixing region 23b and damping regions 23c. The fixing region 23b is held in abutment against the fixing surface 24a of the base member 24 to fix the friction member 23. The damping regions 23c are formed on both outer sides of the fixing region 23b and formed adjacent to the fixing region 23b in the orthogonal direction (Y direction) to be held in contact with the damping members 25. That is, in the friction member 23 in the second embodiment, the damping regions 23c with which the damping members 25 are held in contact are divided and provided on both of the sliding side surfaces 23f1 and the fixing side surface 23f2. The sliding side surfaces 23f1, the fixing side surface 23f2, the sliding region 23a, the fixing region 23b, and the damping regions 23c correspond to the first surface, the second surface, the first region, the second region, and the third region described in claims, respectively.

The shape of the friction member 23 in the second embodiment is similar to the shape of the friction member 13 in the first embodiment, and hence description thereof is omitted.

The base member 24 in the second embodiment has the fixing surface 24a and the recessed portions 24b. The fixing surface 24a is held in abutment against the fixing region 23b of the friction member 23. The recessed portions 24b are formed on both outer sides of the fixing surface 24a and formed adjacent to the fixing surface 24a in the orthogonal direction (Y direction). The fixing surface 24a and the recessed portions 24b both extend in the relative movement direction. The damping members 25 are supplied into the recessed portions 24b.

The damping members 25 in the second embodiment are each an adhesive. Under a state in which the fixing region 23b of the friction member 23 and the fixing surface 24a of the base member 24 are held in contact with each other, the damping members 25 are supplied into the recessed portions 24b. Then, the damping members 25 are supplied until the damping members 25 are brought into contact with respective damping regions 23c of the sliding side surfaces 23f1 and the fixing side surface 23f2. Then, the damping members 25 are cured so that the friction member 23 is bonded and fixed to the base member 24. In the second embodiment, similarly to the first embodiment, the sliding region 23a is arranged so as to be higher in the minus Z direction than the damping regions 23c of the sliding side surfaces 23f1 on which the damping members 25 are provided. Therefore, even when the damping members 25 are unevenly formed, the damping members 25 are prevented from spreading to the sliding region 23a.

Next, description is made of the effect which can be attained with the configuration of the second embodiment. For the vibration wave motor 120 according to the second embodiment, the friction member 23 reduced in thickness is used. Even with such friction member 23 reduced in thickness, the thicknesses of the sliding region 23a and the damping regions 23c of the sliding side surfaces 23f1 differ. Therefore, the damping members 25 supplied onto the damping regions 23c are prevented from spreading to the sliding region 23a. That is, the damping members 25 and the projection portions 21a are not brought into contact with each other, and hence the drive characteristic is not degraded. The damping members 25 are provided to the damping regions 23c of both the sliding side surfaces 23f1 and the fixing side surface 23f2 of the friction member 23, and the damping members 25 are held in contact with the friction member 23. That is, the unnecessary vibration (vibration outside the surface) generated in the friction member 23 reduced in thickness can be damped by fixing the friction member 23 to the base member 24 by pressure. Further, a range of the damping regions 23c held in contact with the damping members 25 is larger than a range in which the projection portions 21a slide on the sliding region 23a, thereby enhancing the damping effect. The surface roughness of the damping regions 23c is larger than the surface roughness of the sliding region 23a, and hence positional displacement in the relative movement direction is less liable to occur. The damping members 25 are provided to reduce the unnecessary vibration of the friction member 23. As a result, degradation in characteristic of the vibration wave motor 120 and generation of noise can be suppressed. Further, the damping members 25 are provided with respect to the sliding region 23a in the orthogonal direction rather than in the relative movement direction. Thus, the entirety of the vibration wave motor 120 is not increased in size in the relative movement direction.

In the second embodiment, the damping regions 23c are formed on surfaces on both sides of the friction member 23, and a contact area between the damping members 25 and the friction member 23 is large. Therefore, there is an advantage that the damping effect attained with the damping members 25 is enhanced. Moreover, the fixing region 23b is formed on an extension line of a pressurizing force applied by a press member 26 to pressurize the vibration body 20 with respect to the friction member 23. Therefore, there arises no problem of plastic deformation of the friction member 23 when the pressurizing force is applied to the friction member 23. Moreover, the damping members 25 are each an adhesive. However, as in the first embodiment, the damping members 25 may be other than the adhesive and may be made of a material exerting the damping effect such as silicon rubber or a gel-like material.

Third Embodiment

Next, description is made of a third embodiment of the present invention with reference to FIG. 7 to FIG. 9A and FIG. 9B. In the second embodiment, the friction member 23 has the T-shaped cross section, and the sliding region 23a projects toward the vibration body 20 side with respect to the damping regions 23c so as to prevent the damping members 25 from spreading to the sliding region 23a. In the third embodiment, a friction member 33 having a thin plate shape with an even thickness is bent so that a sliding region 33a projects toward a vibration body 30 side with respect to damping regions 33c. That is, the third embodiment is different from the second embodiment in that the friction member 33 does not have a T-shaped cross section. Now, detailed description is made of configurations different from those of the second embodiment.

Figure 7:
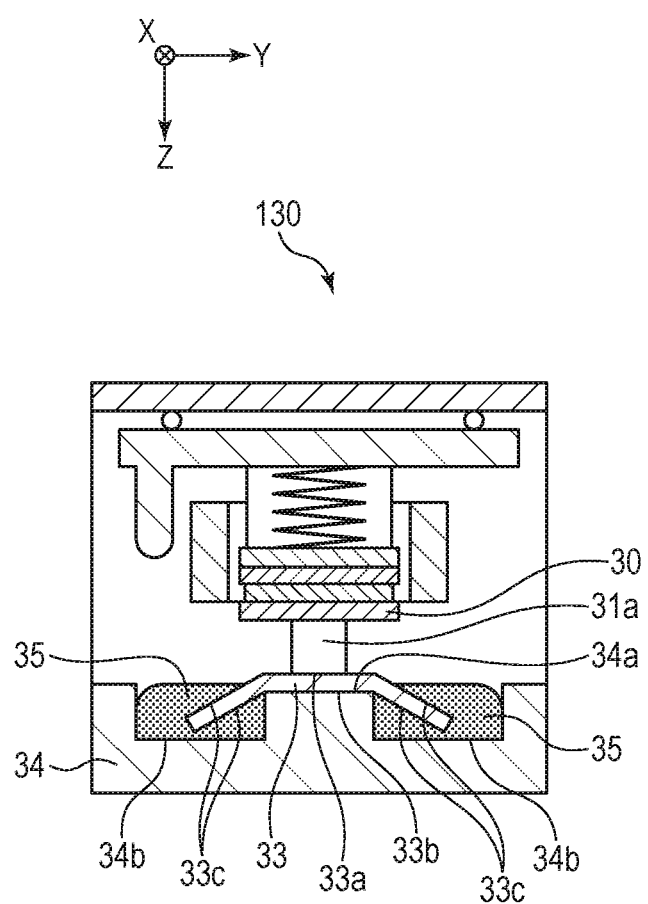
FIG. 7 is a sectional view for illustrating a configuration of a vibration wave motor 130 according to a third embodiment of the present invention.
Figure 8A:
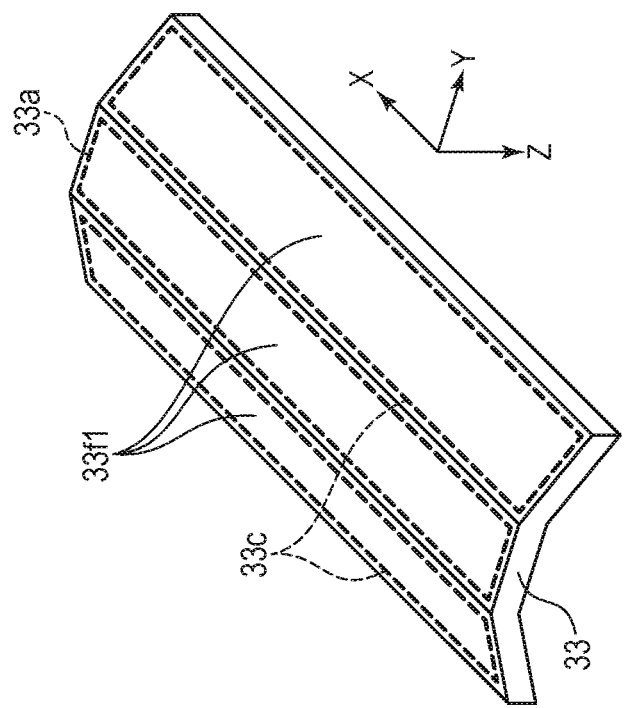
FIG. 8A and FIG. 8B are each a perspective view for illustrating a configuration of a friction member 33 in the third embodiment.
Figure 8B:
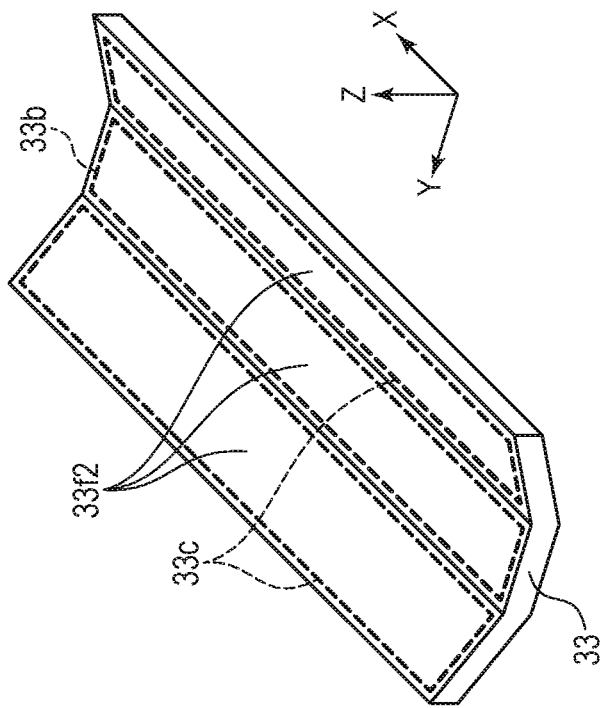

FIG. 7 is a sectional view for illustrating a configuration of a vibration wave motor 130 according to the third embodiment, and is an illustration corresponding to FIG. 2B. FIG. 8A and FIG. 8B are perspective views for illustrating the friction member 33 used for the vibration wave motor 130 according to the third embodiment as seen from different angles. On a side of sliding surfaces 33/1 of the friction member 33, there are formed a sliding region 33a held in abutment against projection portions 31a of the vibration body 30, and damping regions 33c held in contact with damping members 35. Meanwhile, on fixing side surfaces 33/2, there are formed a fixing region 33b and damping regions 33c. The fixing region 33b is held in abutment against a fixing surface 34a of a base member 34 to fix the friction member 33. The damping regions 33c are formed on both outer sides of the fixing region 33b and formed adjacent to the fixing region 33b in the orthogonal direction (Y direction) to be held in contact with the damping members 35. That is, in the friction member 33 in the third embodiment, the damping regions 33c with which the damping members 35 are held in contact are divided and provided on both of the sliding side surfaces 33/1 and the fixing side surfaces 33/2. The sliding side surfaces 33/1, the fixing side surfaces 33/2, the sliding region 33a, the fixing region 33b, and the damping regions 33c correspond to the first surface, the second surface, the first region, the second region, and the third region described in claims, respectively.

The shape of the friction member 33 in the third embodiment is different from that in the second embodiment, and the friction member 33 is formed of a member having a thin plate shape with an even thickness. The vibration body 30 and the friction member 33 move relative to each other in the relative movement direction, and hence the sliding region 33a is elongated in the relative movement direction. The friction member 33 is bent toward the base member 34 side on both outer sides of the sliding region 33a. The damping regions 33c are formed on both of the sliding surfaces 33/1 and the fixing side surfaces 33/2 at the bent portions of the friction member 33, and the friction member 33 is held in contact with the damping members 35 supplied into recessed portions 34b of the base member 34.

The base member 34 in the third embodiment has the recessed portions 34b into which the damping members 35 are supplied. The shape of the base member 34 is similar to that of the base member 24 in the second embodiment, and hence description thereof is omitted.

The damping members 35 in the third embodiment are each an adhesive. Under a state in which the fixing region 33b of the friction member 33 and the fixing surface 34a of the base member 34 are held in contact with each other, the damping members 35 are supplied into the recessed portions 34b. Then, the damping members 35 are supplied until the damping members 35 are brought into contact with respective damping regions 33c of the sliding side surfaces 33/1 and the fixing side surfaces 33/2. Then, the damping members 35 are cured so that the friction member 33 is bonded and fixed to the base member 34. In the third embodiment, similarly to the second embodiment, the sliding region 33a is arranged so as to be higher in the minus Z direction than the damping regions 33c of the sliding side surfaces 33/1 on which the damping members 35 are provided. Therefore, even when the damping members 35 are unevenly formed, the damping members 35 are prevented from spreading to the sliding region 33a. Further, a range of the damping regions 33c held in contact with the damping members 35 is larger than a range in which the projection portions 31a slide on the sliding region 33a.

Next, description is made of the effect which can be attained with the configuration of the third embodiment. For the vibration wave motor 130 according to the third embodiment, the friction member 33 having a thin plate shape with an even thickness is used. The both outer side portions of the sliding region 33a of such friction member 33 having a thin plate shape with an even thickness are bent toward the base member 34 side. Therefore, the damping regions 33c of the sliding side surfaces 33/1 are apart from the vibration body 30 with respect to the sliding region 33a, and the sliding region 33a projects toward the vibration body 30 side. With this configuration, the damping members 35 supplied onto the damping regions 33c are prevented from spreading to the sliding region 33a. That is, the damping members 35 and the projection portions 31a are not brought into contact with each other. Thus, the drive characteristic is not degraded. Moreover, the damping members 35 are provided on the damping regions 33c of both the sliding side surfaces 33/1 and the fixing side surfaces 33f2 of the friction member 33, and the damping members 35 are held in contact with the friction member 33. That is, the unnecessary vibration (vibration outside the surface) generated in the friction member 33 having a thin plate shape with an even thickness can be damped by fixing the friction member 33 to the base member 34 by pressure. Further, a range of the damping regions 33c held in contact with the damping members 35 is larger than a range in which the projection portions 31a slide on the sliding region 33a, thereby enhancing the damping effect. The surface roughness of the damping regions 33c is larger than the surface roughness of the sliding region 33a, and hence positional displacement in the relative movement direction is less liable to occur. The damping members 35 are provided to reduce the unnecessary vibration of the friction member 33. As a result, degradation in characteristic of the vibration wave motor 130 and generation of noise can be suppressed. Further, the damping members 35 are provided with respect to the sliding region 33a in the orthogonal direction rather than in the relative movement direction. Thus, the entirety of the vibration wave motor 130 is not increased in size in the relative movement direction.

In the third embodiment, the friction members 33 can be prepared by bending the friction member 33 having a thin plate shape with an even thickness, and hence there is an advantage that the friction member 33 can be easily processed. Further, the stiffness of the friction member 33 in the relative movement direction is increased by bending the friction member 33 along the relative movement direction. The friction member 33 is a member having a thin plate shape. Thus, the friction member 33 has a unique vibration mode which causes resonance at a certain frequency "f". The friction member 33 is held in abutment against the vibration body 30 which generates high-frequency vibration, and hence the vibration of the vibration body 30 is transmitted to the friction member 33. When the friction member 33 has the unique vibration mode which causes resonance at the frequency "f" of the high-frequency vibration of the vibration body 30, the friction member 33 resonates due to the vibration of the vibration body 30.

Next, description is made of resonance frequencies fn of the vibration mode generated in the friction member 33. FIG. 9A is a graph for showing resonance frequencies fna given when the stiffness of the friction member 33 is low. FIG. 9B is a graph for showing resonance frequencies fnb given when the stiffness of the friction member 33 is high. In those graphs, the horizontal axis represents the frequency "f", and the vertical axis represents an amplitude A. In each graph, it is shown that the resonance occurs at a certain frequency "f". In the vibration wave motor 130, in order to control a relative moving speed by controlling the frequency "f" of the high-frequency vibration of the vibration body 30, the vibration body 30 is vibrated at high frequency in a predetermined frequency range in use. When the stiffness is low, intervals of the resonance frequencies f1a, f2a, f3a, and f4a are small as shown in FIG. 9A, and any one of the resonance frequencies fna falls within the frequency range in use, with the result that the unnecessary vibration is liable to be generated in the friction member 33. However, when the stiffness of the friction member 33 is high, the intervals of the resonance frequencies f1b, f2b, f3b, and f4b are large as shown in FIG. 9B. Therefore, the resonance frequencies fnb can be set outside the frequency range in use, thereby being capable of reducing the unnecessary vibration generated in the friction member 33.

Fourth Embodiment

Figure 10:
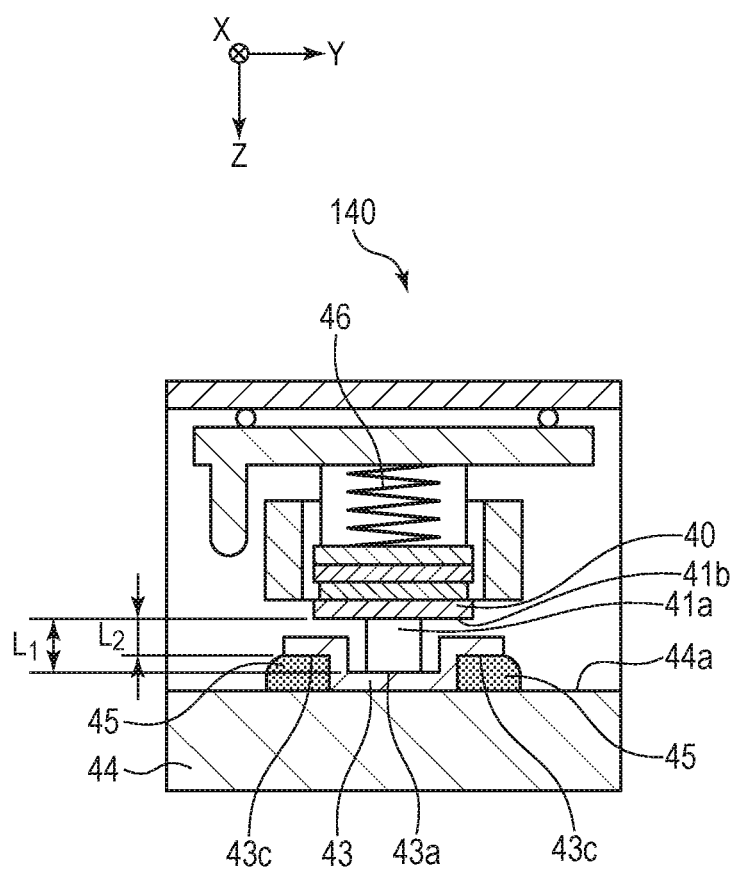
FIG. 10 is a sectional view for illustrating a configuration of a vibration wave motor 140 according to a fourth embodiment of the present invention.
Figure 11B:
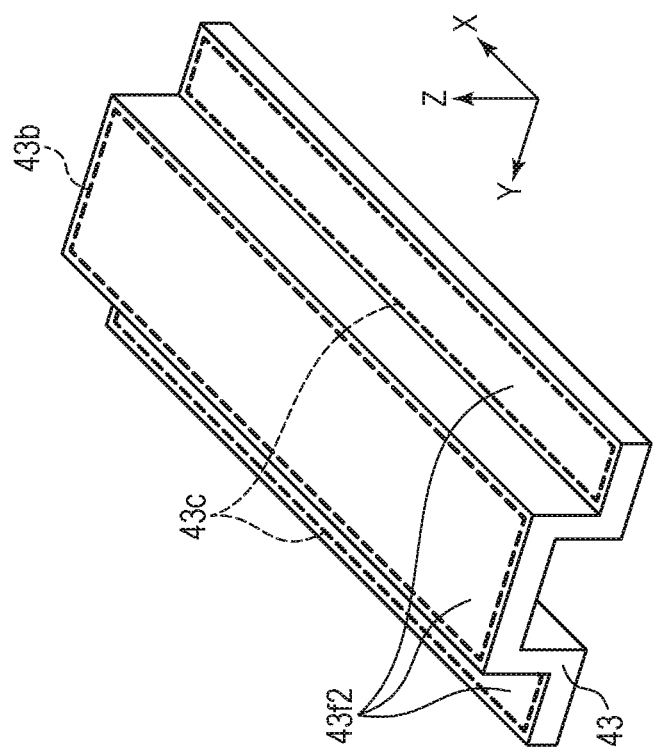
FIG. 11A and FIG. 11B are each a perspective view for illustrating a configuration of a friction member 43 in the fourth embodiment.
Figure 11A:
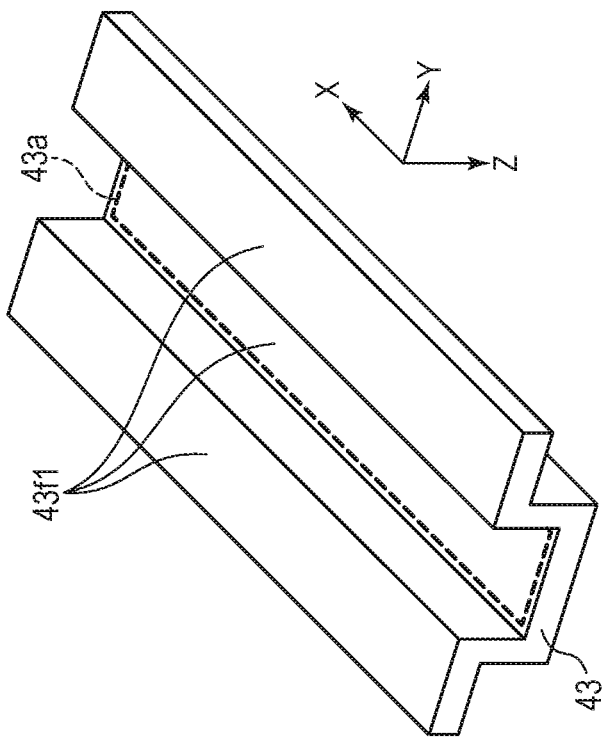

Next, description is made of a fourth embodiment of the present invention with reference to FIG. 10, FIG. 11A, and FIG. 11B. In the first embodiment, the damping members 15 are provided only on the sliding side surface 13f1 side of the friction member 13. In the fourth embodiment, damping members 45 are provided on fixing side surfaces 43f2 of a friction member 43 having a thin plate shape with an even thickness, and the damping members 45 are prevented from spreading to a sliding region 43a by bending the friction member 43. That is, the fourth embodiment is different from the first embodiment in that the friction member 43 does not have a T-shaped cross section. Now, detailed description is made of configurations different from those of the first embodiment.

FIG. 10 is a sectional view for illustrating a configuration of a vibration wave motor 140 according to the fourth embodiment, and is an illustration corresponding to FIG. 2B. FIG. 11A and FIG. 11B are perspective views for illustrating the friction member 43 used for the vibration wave motor 140 according to the fourth embodiment as seen from different angles. On a side of sliding side surfaces 43f1 of the friction member 43, there is formed the sliding region 43a held in abutment against projection portions 41a of a vibration body 40. Meanwhile, on the fixing side surfaces 43f2, there is formed a fixing region 43b held in abutment against a fixing surface 44a of the base member 44 to fix the friction member 43. Further, on the fixing side surfaces 43f2, there are formed damping regions 43c, which are divided on both outer sides of the fixing region 43b and formed adjacent to the fixing region 43b in the orthogonal direction (Y direction) to be held in contact with the damping members 45. That is, in the friction member 43 in the fourth embodiment, the damping regions 43c with which the damping members 45 are held in contact are formed only on the fixing side surfaces 43f2. The sliding side surfaces 43f1, the fixing side surfaces 43f2, the sliding region 43a, the fixing region 43b, and the damping regions 43c correspond to the first surface, the second surface, the first region, the second region, and the third region described in claims, respectively.

The shape of the friction member 43 in the fourth embodiment is different from that in the first embodiment, and the friction member 43 is formed of a member having a thin plate shape with an even thickness. The friction member 43 is held in abutment against the projection portions 41a of the vibration body 40 at the sliding region 43a, and is held in abutment against the fixing surface 44a of the base member 44 at the fixing region 43b. The vibration body 40 and the friction member 43 move relative to each other in the relative movement direction, and hence the sliding region 43a is elongated in the relative movement direction. The friction member 43 is bent by approximately 90 degrees on the both outer sides of the sliding region 43a toward the vibration body 40 side. The bent portions of the friction member 43 are further bent by approximately 90 degrees toward the outer sides with respect to the sliding region 43a, and the friction member 43 has such a shape that the fixing region 43b projects toward the base member 44 side. Regions on the fixing side surface 43f2 side of the further bent portions of the friction member 43 serve as the damping regions 43c, and the damping regions 43c are held in contact with the damping members 45 supplied between the friction member 43 and the base member 44. That is, the fixing side surfaces 43f2 have the fixing region 43b and the damping regions 43c held in contact with the damping members 45. Moreover, positions of the sliding region 43a and the damping regions 43c in a pressurizing direction of a press member 46 are different. Further, a distance L1 from a flat plate portion 41b to the sliding region 43a is larger than a distance L2 from the flat plate portion 41b to the damping region 43c, and hence the damping regions 43c are closer to the flat plate portion 41b than the sliding region 43a in the pressurizing direction of the press member 46.

The shape of the base member 44 in the fourth embodiment is similar to the shape of the base member 14 in the first embodiment, and hence description thereof is omitted.

The damping members 45 in the fourth embodiment are each an adhesive. Under a state in which the fixing region 43b of the friction member 43 and the fixing surface 44a of the base member 44 are held in contact with each other, the damping members 45 are supplied into spaces each being surrounded by the damping region 43c on the fixing side surface 43f2 side and the fixing surface 44a. Then, the damping members 45 are supplied until the damping members 45 are brought into contact with the damping regions 43c of the fixing side surfaces 43f2. Then, the damping members 45 are cured so that the friction member 43 is bonded and fixed to the base member 44. In the fourth embodiment, the friction member 43 is bent toward the vibration body 40 side, and the damping members 45 are provided between the fixing side surfaces 43f2 and the base member 44. Therefore, even when the damping members 45 are unevenly formed, the damping members 45 are prevented from spreading to the sliding region 43a.

Next, description is made of the effect which can be attained with the configuration of the fourth embodiment. For the vibration wave motor 140 in the fourth embodiment, the friction member 43 having a thin plate shape with an even thickness is used. Even with such friction member 43 having a thin plate shape with an even thickness, the friction member 43 is bent toward the vibration body 40 side. Therefore, the damping members 45 supplied onto the damping regions 43c of the fixing side surfaces 43f2 are prevented from spreading to the sliding region 43a. That is, the damping members 45 and the projection portions 41a are not brought into contact with each other, and hence the drive characteristic is not degraded. The damping members 45 are provided to the damping regions 43c of the fixing side surfaces 43f2 of the friction member 43, and are held in contact with the friction member 43. Thus, the unnecessary vibration generated in the friction member 43 having a thin plate shape with an even thickness can be damped. Further, a range of the damping regions 43c held in contact with the damping members 45 is larger than a range in which the projection portions 41a slide on the sliding region 43a, thereby enhancing the damping effect. The surface roughness of the damping regions 43c is larger than the surface roughness of the sliding region 43a, and hence positional displacement in the relative movement direction is less liable to occur. The damping members 45 are provided to reduce the unnecessary vibration of the friction member 43. As a result, degradation in characteristic of the vibration wave motor 140 and generation of noise can be suppressed. Further, the damping members 45 are provided with respect to the sliding region 43a in the orthogonal direction rather than in the relative movement direction. Thus, the entirety of the vibration wave motor 140 is not increased in size in the relative movement direction.

In the fourth embodiment, the friction member 43 having a thin plate shape with an even thickness is bent toward the vibration body 40 side so that the damping regions 43c are formed on the outer sides of the sliding region 43a and in the orthogonal direction (Y direction) with respect to the sliding region 43a. With such a configuration, the friction member 43 and the damping members 45 can be arranged in open spaces on both sides of the projection portions 41a of the vibration body 40. Therefore, there is an advantage that the vibration of the friction member 43 can be damped without increase in size in the pressurizing direction.

Moreover, in the fourth embodiment, the friction member 43 is bent, and hence the stiffness of the friction member 43 in the relative movement direction is high. Therefore, similarly to the third embodiment, the effect that the plurality of resonance frequencies fnb of the friction member 43 can be set outside the frequency range in use, that is, the effect attained when the stiffness of the friction member 43 is high can be attained, and the unnecessary vibration generated in the friction member 43 can be reduced.

Fifth Embodiment

Next, description is made of a fifth embodiment of the present invention with reference to FIG. 12A and FIG. 12B to FIG. 14. In the first embodiment, the entirety of the fixing side surface 13f2 of the friction member 13 has the fixing region 13b and is held in contact with the fixing surface 14a of the base member 14, and the damping regions 13c with which the damping members 15 are held in contact are formed only on the sliding side surface 13f1 side. In the fifth embodiment, a friction member 53 reduced in thickness has a flat plate shape, and damping regions 53c are arranged on a fixing side surface 53f2 along the relative movement direction. Further, in a base member 54, a plurality of recessed portions 54b in which damping members 55 are supplied are formed along the relative movement direction. Those configurations are different from those of the first embodiment. Now, detailed description is made of configurations different from those of the first embodiment.

Figure 13B:
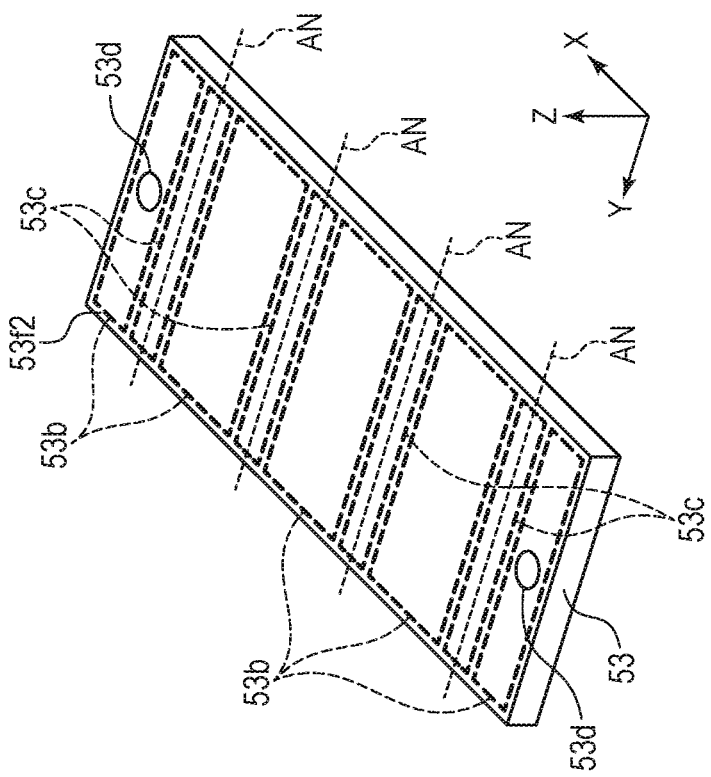
FIG. 13A and FIG. 13B are each a perspective view for illustrating a configuration of a friction member 53 in the fifth embodiment.
Figure 13A:
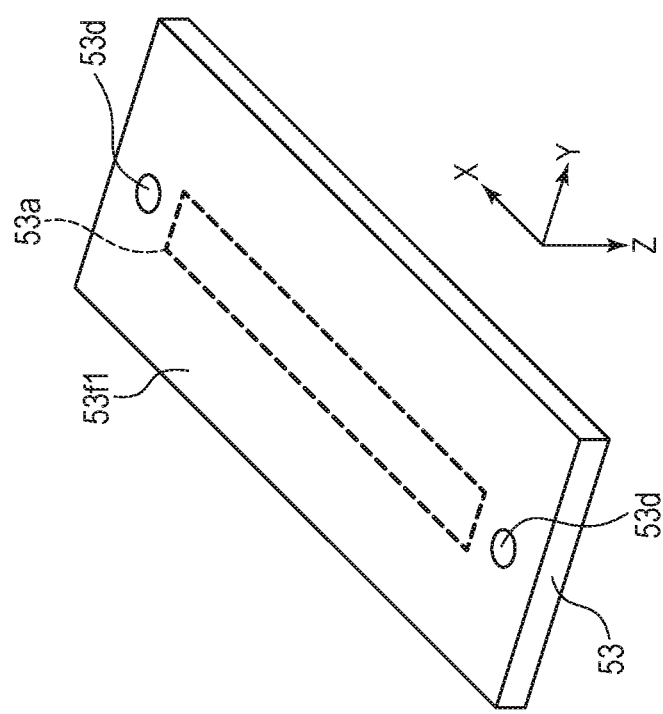

FIG. 12A is a sectional view for illustrating a vibration wave motor 150 according to the fifth embodiment, which is taken along an X-Z plane passing through a center of a press member 56. FIG. 12B is a sectional view taken along a section line XIIB-XIIB of FIG. 12A. FIG. 13A and FIG. 13B are perspective views for illustrating the friction member 53 used for the vibration wave motor 150 according to the fifth embodiment as seen from different angles. On a sliding side surface 53f1 side of the friction member 53, there is formed a sliding region 53a held in abutment against projection portions 51a of a vibration body 50. Meanwhile, on the fixing side surface 53f2, there are formed a plurality of fixing regions 53b, which are held in abutment against fixing surfaces 54a of the base member 54 to fix the friction member 53, so as to extend in the orthogonal direction (Y direction) rather than in the relative movement direction. Further, there are formed the plurality of divided damping regions 53c, which are arranged adjacent to the fixing regions 53b in the relative movement direction and held in contact with the damping members 55. The damping regions 53c and the fixing regions 53b are positioned on the same plane. The sliding side surface 53f1, the fixing side surface 53f2, the sliding region 53a, the fixing regions 53b, and the damping regions 53c correspond to the first surface, the second surface, the first region, the second region, and the third region described in claims, respectively.

The shape of the friction member 53 in the fifth embodiment is different from that in the first embodiment, and is a plate-like shape with a reduced thickness. At both end portions of the friction member 53 in the relative movement direction, there are formed screw holes 53 for fixing the friction member 53 to the base member 54. The friction member 53 is held in abutment against the vibration body 50 which vibrates at high frequency, and hence the vibration of the vibration body 50 is transmitted to the friction member 53. The friction member 53 has a unique vibration mode which causes resonance around the frequency "f" of the high-frequency vibration of the vibration body 50, and hence the friction member 33 resonates due to the vibration of the vibration body 50.

The base member 54 in the fifth embodiment has the fixing surfaces 54a and the plurality of recessed portions 54b. The fixing surfaces 54a are held in abutment against the fixing regions 53b of the friction member 53. The recessed portions 54b are arranged adjacent to the fixing surfaces 54a. The fixing surfaces 54a and the recessed portions 54b are formed so as to be arrayed alternately along the relative movement direction, and are arranged in the pressurizing direction of the press member 56. Both the fixing surfaces 54a and the recessed portions 54b extend in the orthogonal direction (Y direction) rather than in the relative movement direction. The damping members 55 are supplied into the recessed portions 54b.

The damping members 55 in the fifth embodiment are each an adhesive. Under a state in which the fixing regions 53b of the friction member 53 and the fixing surfaces 54a of the base member 54 are held in contact with each other, the damping members 55 are supplied into the recessed portions 54b. Then, the damping members 55 are cured so that the friction member 53 is bonded and fixed to the base member 54. The adhesive contracts at the time of curing. Thus, after the curing, contraction stress generated by curing contraction is accumulated in the adhesive. When the contraction stress is large, there arises problems such as degradation in bonding strength. However, in the fifth embodiment, the damping members 55 are divided in the relative movement direction. Thus, the contraction stress due to curing contraction is small, thereby being capable of improving bonding strength.

Figure 14:
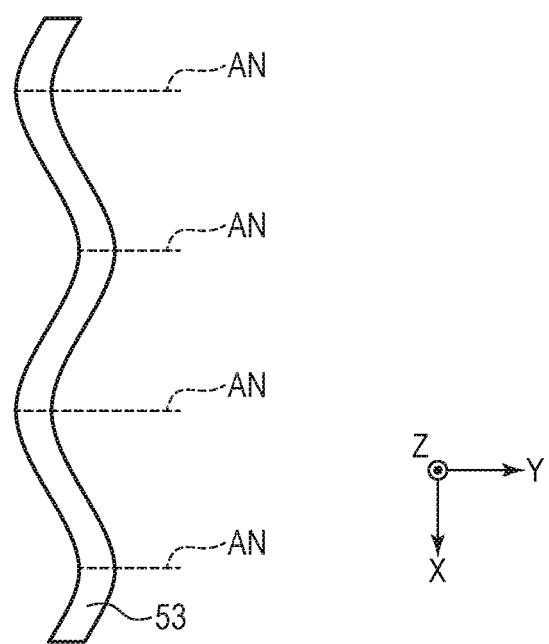
FIG. 14 is a schematic view for illustrating vibration caused by resonance of the friction member 53 in the fifth embodiment.

FIG. 14 is a schematic view for illustrating the vibration due to the resonance of the friction member 53. The dotted lines indicate antinodes AN of the unique vibration mode of the friction member 53 which resonates at the frequency "f" of the high-frequency vibration of the vibration body 50. In the fifth embodiment, the damping members 55 are at least divided into a plurality of sections in the relative movement direction, and the damping members 55 are held in contact with the friction member 53 on the antinodes AN (or in the vicinities of the antinodes) of the unique vibration mode of the friction member 53. In the above, description is made of an example of a fourth-order unique vibration mode having four antinodes AN. However, the unique vibration mode to be generated may vary depending on the frequency "f" of the high-frequency vibration of the vibration body 50 or the shape of the friction member 53.

Figure 15:
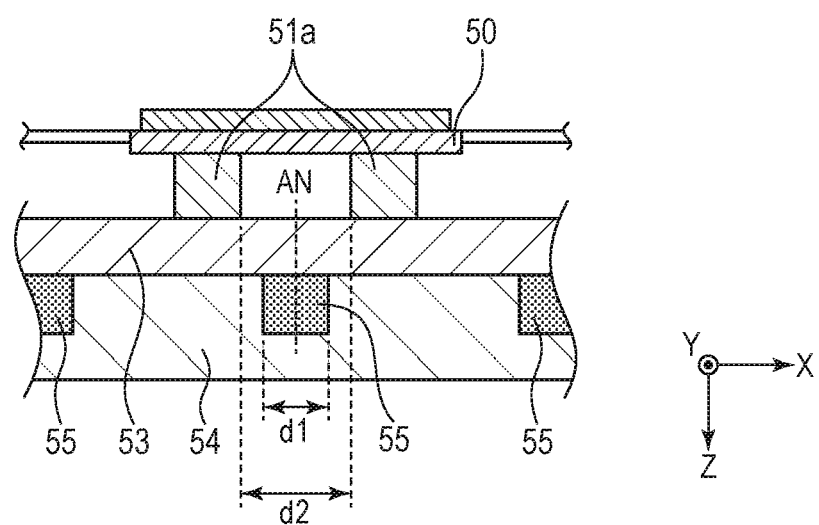
FIG. 15 is a partial enlarged view of FIG. 12A.

FIG. 15 is a partial enlarged view of FIG. 12A. In FIG. 15, only the vibration body 50, the friction member 53, the base member 54, and the damping members 55 are illustrated, and description of other components is omitted. The vibration body 50 includes a plurality of projection portions 51a, and an interval of the projection portions 51a in the relative movement direction is represented by d2. When a length of one damping member 55 (or recessed portion 54b) in the relative movement direction is represented by d1, the length d1 is smaller than the interval d2. Centers of the recessed portions 54b in the relative movement direction substantially match with the antinodes AN of the resonance mode of the friction member 53.

Next, description is made of the effect which can be attained with the configuration of the fifth embodiment. In the fifth embodiment, the friction member 53 having a plate shape with a reduced thickness is used. Even with such friction member 53 having a plate shape with a reduced thickness, the sliding region 53a and the damping regions 53c are prevented from being adjacent to each other. Thus, the damping members 55 supplied into the recessed portions 54b are prevented from spreading to the sliding region 53a. That is, the damping members 55 and the projection portions 51a are not brought into contact with each other, and hence the drive characteristic is not degraded. Moreover, the damping members 55 are provided in the vicinities of the antinodes AN of the unique vibration mode of the friction member 53. Thus, the unnecessary vibration generated in the friction member 53 having a plate shape with a reduced thickness can be positively damped. The damping members 55 are provided to reduce the unnecessary vibration of the friction member 53. As a result, degradation in characteristic of the vibration wave motor 150 and generation of noise can be suppressed. Further, the damping members 55 are provided in the pressurizing direction, rather than in the relative movement direction or the orthogonal direction (Y direction) thereof. Thus, the size of the vibration wave motor 150 in the Y direction can be reduced.

In the fifth embodiment, the damping members 55 are each an adhesive, and are configured to fix the friction member 53 and damp the vibration of the friction member 53. However, the damping members 55 may be other than the adhesive and may be made of a material having a stiffness lower than that of the base member 54, such as silicon rubber or a gel-like material. In this case, the stiffness of each of the fixed portions including the friction member 53, the base member 54, and the damping members 55 is lower as compared to the related-art example. When the stiffness of the fixed portion is low, the elliptic motion at the distal ends of the projection portions 51a of the vibration body 50 cannot be efficiently converted into a drive force, with the result that the drive performance is degraded. In the fifth embodiment, the damping members 55 are divided into a plurality of sections in the relative movement direction (X direction), and regions other than the damping regions 53c of the friction member 53 are supported as the fixing regions 53b on the base member 54, thereby being capable of suppressing degradation in stiffness of the fixed portions and suppressing degradation in drive performance. Further, when the length d1 of the damping member 55 in the relative movement direction is larger than the interval d2 of the projection portions 51a, there is a risk in that the pressurizing force given by the press member 56 causes plastic deformation or brittle fracture of the friction member 53. However, in the fifth embodiment, the length d1 of the damping member 55 in the relative movement direction is less than the interval d2 of the projection portions 51a, and hence warpage or brittle fracture can be suppressed.

When the silicon rubber or the gel-like material is used as the damping member 55, end portions of the friction member 53 in the relative movement direction are completely fixed by another fixing means such as screws 57 or an adhesive, and the fixing side surface 53f2 and the fixing surfaces 54a of the base member 54 are brought into abutment against each other. The resonance frequencies fn of the friction member 53 can be fixed by completely fixing the end portions. Alternatively, the friction member 53 may be formed through insert molding integrally with a mold.

Embodiments of the present invention are described above, but the present invention is not limited to the embodiments and can be modified and changed variously within the scope of the gist thereof.

Application Example

Now, description is made of a lens driving device 200 to which, for example, the vibration wave motor 110 according to the embodiment of the present invention is applied. FIG. 16A is a front view for illustrating the lens driving device 200, and FIG. 16B is a sectional view taken along the line XVIB-XVIB of FIG. 16A.

The lens 201 (driven member) is fixed to a lens retaining member 202. The lens retaining member 202 has a through hole 202a and a U-groove portion 202b to be engaged with a guide bar 203a and a guide bar 203b, respectively. The lens 201 and the lens retaining member 202 are linearly guided in an optical axis I direction. An engagement portion 202c is engaged with a coupling portion 3a formed on the movable member 3 of the vibration wave motor 110. The movable member 3 and the lens retaining member 202 move integrally with each other.

The lens driving device 200 includes the lens 201 and the vibration wave motor 110. As described above, the movable member 3 moves integrally with the vibration body 10. Therefore, the lens 201 can be moved in the optical axis direction by the relative movement of the vibration body 10 and the friction member 13.

The present invention is applicable to, for example, electronic equipment, in particular, a lens driving device for which small size and weight and a wide driving speed range are required.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-156400, filed Aug. 14, 2017, which is hereby incorporated by reference herein in its entirety.

What is claimed is:

1. A vibration wave motor comprising:
   a vibration body including a piezoelectric element;
   a friction member held in friction contact with the vibration body;
   a press member configured to pressurize the vibration body against the friction member;
   a base member configured to fix the friction member; and
   a damping member configured to damp vibration generated in the friction member,
   wherein the vibration body and the friction member are configured to move relative to each other,
   wherein the friction member includes:
      a first surface having a first region held in abutment against the vibration body; and
      a second surface, which is a back surface of the first surface, and has a second region held in abutment against the base member,
   wherein at least one of the first surface and the second surface has a third region held in contact with the damping member,
   wherein positions of the first region and the third region in a pressurizing direction of the press member are different from each other, and
   wherein the damping member comprises an adhesive.

2. A vibration wave motor according to claim 1,
   wherein the first surface has the third region, and
   wherein the third region is arranged more apart from the vibration body than the first region in the pressurizing direction.

3. A vibration wave motor according to claim 1,
   wherein the vibration body includes a projection portion and a flat plate portion,
   wherein the second surface has the third region, and
   wherein the third region is arranged closer to the flat plate portion than the first region in the pressurizing direction.

4. A vibration wave motor according to claim 1,
   wherein the third region is formed so as to extend in a relative movement direction, and is arranged so as to be on an outer side of the first region and be adjacent to the first region in a direction orthogonal to the direction of relative movement.

5. A vibration wave motor according to claim 1, wherein the first surface and the second surface each have the third region.

6. A vibration wave motor according to claim 1, wherein the friction member is fixed on the base member by the damping member.

7. A vibration wave motor according to claim 1, wherein end portions of the friction member in the direction of relative movement are completely fixed to the base member by one of a screw and an adhesive.

8. A vibration wave motor according to claim 1,
   wherein high-frequency vibration to be generated in the vibration body through application of a drive voltage to the piezoelectric element is vibration of a frequency in an ultrasonic range, and
   wherein the vibration wave motor comprises an ultrasonic motor which uses the vibration of the frequency in the ultrasonic range.

9. An electronic equipment, comprising:
   a driven member; and
   a vibration wave motor,
   wherein the vibration wave motor comprises:
   a vibration body including a piezoelectric element;
   a friction member held in friction contact with the vibration body;
   a press member configured to pressurize the vibration body against the friction member;
   a base member configured to fix the friction member; and
   a damping member configured to damp vibration generated in the friction member,
   wherein the vibration body and the friction member are configured to move relative to each other,
   wherein the friction member includes:
      a first surface having a first region held in abutment against the vibration body; and
      a second surface, which is a back surface of the first surface, and has a second region held in abutment against the base member,
   wherein at least one of the first surface and the second surface has a third region held in contact with the damping member,
   wherein positions of the first region and the third region in a pressurizing direction of the press member are different from each other,
   wherein the damping member comprises an adhesive, and
   wherein the driven member moves by the relative movement of the vibration body and the friction member.

10. The electronic equipment according to claim 9,
    wherein the electric equipment is a lens driving apparatus, which has a lens moving by a movement of the driven member.

11. A vibration wave motor comprising:
    a vibration body including a piezoelectric element;
    a friction member held in friction contact with the vibration body;
    a press member configured to pressurize the vibration body against the friction member;
    a base member configured to fix the friction member; and a damping member configured to damp vibration generated in the friction member, wherein the vibration body and the friction member are configured to move relative to each other, wherein the base member has a plurality of recessed portion in a surface of the base member held in abutment against the friction member, wherein the plurality of recessed portions are formed along a direction of relative movement, and wherein the damping member is supplied into the plurality of recessed portions and comprises an adhesive.

12. A vibration wave motor according to claim 11, wherein the friction member includes:
- a first surface having a first region held in abutment against the vibration body; and
- a second surface having a second region held in abutment against the base member and a third region held in contact with the damping member, and wherein the second region and the third region are formed alternately in the relative movement direction on the same plane.

13. A vibration wave motor according to claim 11, wherein the vibration body includes a plurality of projection portions, and wherein a length of the damping member in the direction of relative movement is smaller than an interval of the plurality of projection portions.

14. A vibration wave motor according to claim 11, wherein the damping member is provided in a vicinity of each of antinodes in a unique vibration mode of the friction member configured to resonate at a frequency of high-frequency vibration generated in the vibration body.

15. A vibration wave motor according to claim 11, wherein the friction member is fixed on the base member by the damping member.

16. A vibration wave motor according to claim 11, wherein end portions of the friction member in the direction of relative movement are completely fixed to the base member by one of a screw and an adhesive.

17. A vibration wave motor according to claim 11, wherein high-frequency vibration to be generated in the vibration body through application of a drive voltage to the piezoelectric element is vibration of a frequency in an ultrasonic range, and wherein the vibration wave motor comprises an ultrasonic motor which uses the vibration of the frequency in the ultrasonic range.

18. An electronic equipment, comprising:
a driven member; and
a vibration wave motor,
wherein the vibration wave motor comprises:
a vibration body including a piezoelectric element;
a friction member held in friction contact with the vibration body;
a press member configured to pressurize the vibration body against the friction member;
a base member configured to fix the friction member; and
a damping member configured to damp vibration generated in the friction member, wherein the vibration body and the friction member are configured to move relative to each other, wherein the base member has a plurality of recessed portion in a surface of the base member held in abutment against the friction member, wherein the plurality of recessed portions are formed along a direction of relative movement, wherein the damping member is supplied into the plurality of recessed portions and comprises an adhesive, and wherein the driven member moves by the relative movement of the vibration body and the friction member.

19. The electronic equipment according to claim 18, wherein the electric equipment is a lens driving apparatus, which has a lens moving by a movement of the driven member.

* * * * *